United States Patent [19]
Anderson

[11] Patent Number: 5,397,716
[45] Date of Patent: Mar. 14, 1995

[54] METHOD OF FORMING AN INSULATED GATE SEMICONDUCTOR DEVICE

[75] Inventor: Samuel J. Anderson, Tempe, Ariz.

[73] Assignee: Motorola, Inc., Schaumburg, Ill.

[21] Appl. No.: 55,581

[22] Filed: May 3, 1993

[51] Int. Cl.⁶ ........................................... H01L 21/265
[52] U.S. Cl. .......................................... 437/31; 437/6;
    437/177; 437/179
[58] Field of Search ................... 437/6, 31, 974, 175,
    437/177, 178, 179; 148/DIG. 139, DIG. 140

[56]         References Cited
         U.S. PATENT DOCUMENTS

| | | | |
|---|---|---|---|
| 5,079,607 | 1/1992 | Sakurai | 357/23.7 |
| 5,171,696 | 12/1992 | Hagino | 437/31 |
| 5,178,370 | 1/1993 | Clark et al. | 257/212 |
| 5,264,378 | 11/1993 | Sakurai | 437/974 |
| 5,273,917 | 12/1993 | Sakurai | 437/974 |

Primary Examiner—Brian E. Hearn
Assistant Examiner—Tuan Nguyen
Attorney, Agent, or Firm—Rennie W. Dover

[57]         ABSTRACT

A method of forming an insulated gate semiconductor device (10). A field effect transistor and a bipolar transistor are formed in a portion of a monocrystalline semiconductor substrate (11) that is bounded by a first major surface (12). A control electrode (19) is isolated from the first major surface by a dielectric layer (18). A first current conducting electrode (23) contacts a portion of the first major surface (12). A second current conducting electrode (24) contacts another portion of the monocrystalline semiconductor substrate (11) and is capable of injecting minority carriers into the monocrystalline semiconductor substrate (11). In one embodiment, the second current conducting electrode contacts a second major surface (13) of the monocrystalline semiconductor substrate (11).

16 Claims, 1 Drawing Sheet

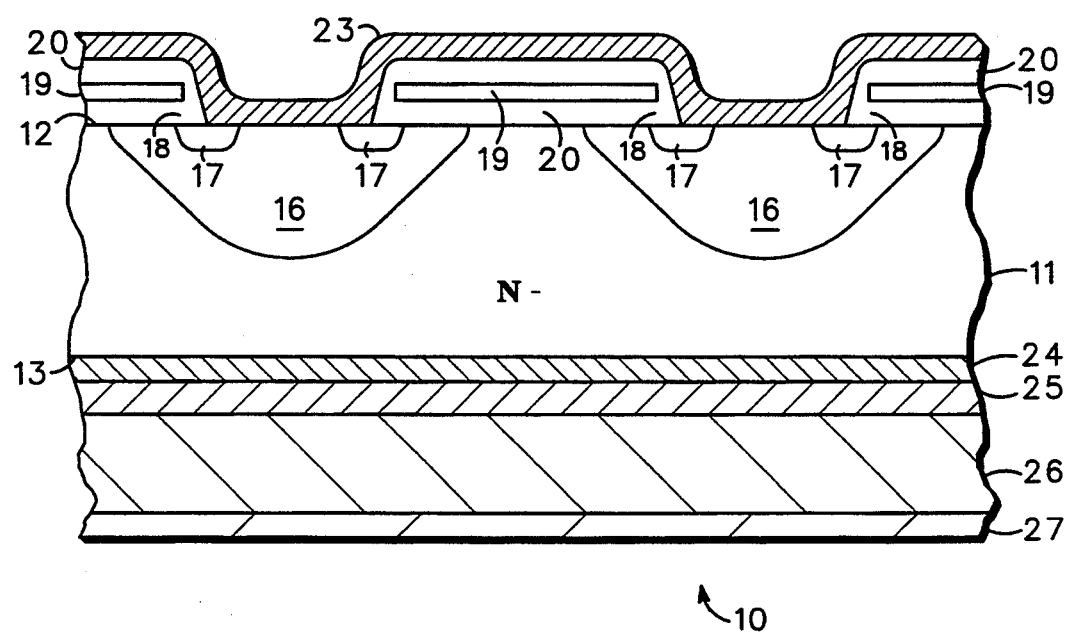

METHOD OF FORMING AN INSULATED GATE SEMICONDUCTOR DEVICE

BACKGROUND OF THE INVENTION

The present invention relates, in general, to methods of forming power semiconductor devices and, more particularly, to methods of forming insulated gate semiconductor devices.

Power semiconductor devices are used in such applications as variable speed motor controllers, uninterruptible power supplies, and high frequency welders. Included in this category of semiconductor devices are power metal oxide semiconductor field effect transistors (MOSFET's) and insulated gate bipolar transistors (IGBT's). Both types of devices offer similar gate drive and peak current capabilities as well as a wide safe operating area (SOA). However, IGBT's have superior conduction characteristics compared to power MOSFET's, whereas power MOSFET's are generally superior to IGBT's in terms of switching speeds.

Typically, IGBT's include a substrate layer of a P conductivity type on which a relatively lightly doped epitaxial layer of an N conductivity type is formed, thereby forming a PN junction. Most of the IGBT circuitry is fabricated in the epitaxial layer (more commonly referred to as the drift region), wherein the substrate layer serves as a bottom-side contact for the IGBT and forms an emitter region of a PNP transistor. The light doping of the epitaxial layer produces a drift region having a low conductivity, a high resistivity, and is capable of supporting high voltages. However, the high resistivity increases the "on" resistance, or the resistance during forward conduction, which in turn limits the current rating of the IGBT. The PN junction formed between the substrate and the epitaxial layer lowers the "on" resistance by injecting minority carriers into the drift region. In addition, the injection of minority carriers increases the conductivity of the drift region.

The modulation of the "on" resistance and the conductivity of the drift region by injection of minority carriers across the PN junction implies that both majority and minority carriers participate significantly in current flow in the IGBT. Although the use of both carrier types is advantageous for "on" resistance and conductivity, during shut-off of the IGBT the carriers produce a "tail" current which delays the shut-off of the device. It is believed that the charge associated with the "tail" current may be reduced and the shut-off delay improved by, for example, providing recombination centers in the lattice structure of the epitaxial layer. These recombination centers may be formed by creating imperfections or damage in the epitaxial layer lattice structure using such means as irradiating the epitaxial layer. Another solution is to insert a buffer zone between the substrate and the drift region, wherein the buffer zone is epitaxial silicon having the same conductivity type as the drift region but having a higher concentration of impurity material.

Accordingly, it would be advantageous to have a method of forming an IGBT having a lower "on" resistance, and a greater conductivity in the drift region. It would be further advantageous that the method exclude the formation of recombination centers and a buffer zone as these steps increase the cost and cycle time associated with manufacturing IGBT's, as well as the minimum thickness of wafers from which IGBT's are manufactured. In addition, the method should improve the switching speed of the IGBT.

SUMMARY OF THE INVENTION

Briefly stated, the present invention provides a method of forming an insulated gate semiconductor device. In the method of the present invention, a monocrystalline semiconductor substrate having a first portion bounded by a first major surface and a second portion bounded by a second major surface is provided. A field effect transistor and at least one bipolar transistor are formed in the first portion of the monocrystalline semiconductor substrate. In addition, a control electrode and a first current conducting electrode are formed wherein the control electrode is spaced apart from the first major surface by a dielectric layer and the first current conducting electrode contacts the first major surface. A metal-semiconductor contact is formed with the monocrystalline semiconductor substrate, which serves as a second current conducting electrode, and is capable of injecting minority carriers into the monocrystalline semiconductor substrate.

In another aspect, the present invention is an insulated gate semiconductor device formed in a monocrystalline semiconductor substrate of a first conductivity type. A base region of a second conductivity type extends into the monocrystalline semiconductor substrate and a source region of the first conductivity type extends into the base region. A channel is in the portion of the base region between the source region and the monocrystalline semiconductor substrate of the first conductivity type. A gate electrode is over the channel and a source electrode is over the base region. A metal-semiconductor contact contacts a portion of the monocrystalline semiconductor substrate that is doped with the impurity material of the first conductivity type and the first concentration such that the metal-semiconductor contact is capable of injecting minority carriers into the monocrystalline semiconductor substrate.

BRIEF DESCRIPTION OF THE DRAWING

The single FIGURE illustrates a cross-sectional view of a vertical insulated gate bipolar transistor in accordance with the present invention.

DETAILED DESCRIPTION OF THE DRAWING

The single FIGURE illustrates a highly simplified cross-sectional view of a portion of a vertical embodiment of an insulated gate semiconductor device 10 in accordance with the present invention. More particularly, insulated gate semiconductor device 10 is an insulated gate bipolar transistor, commonly referred to as an IGBT. Although the present invention is described in terms of an N channel insulated gate semiconductor device, it shall be understood that P channel insulated gate semiconductor devices can be manufactured with minor modifications to the fabrication steps described hereinafter.

Semiconductor device 10 is fabricated in a monocrystalline semiconductor substrate 11, wherein semiconductor substrate 11 is comprised of a first or upper portion which is bounded by a first major surface 12 and a second or lower portion which is bounded by a second major surface 13. Semiconductor substrate 11 is commonly referred to as a drift region. Drift region 11 has a thickness ranging between approximately 100 micrometers and approximately 300 micrometers and is lightly doped with a dopant or impurity material of N conductivity type. In one example, drift region 11 has an impurity material concentration of approximately $1 \times 10^{14}$ atoms per cubic centimeter. Drift region 11 is a monocrystalline semiconductor material having a substantially uniform impurity concentration of N conductivity type that may be formed using non-epitaxial growth techniques such as a Czochralski process or a float zone process, or using epitaxial growth techniques. It is preferable to form drift region 11 using the Czochralski process owing to its lower costs.

In the vertical embodiment, an insulated gate semiconductor device is fabricated in the first portion of drift region 11 by forming at least two base wells or regions 16 of P conductivity type. It will be understood that in an actual device 10 there will be a large number of base wells 16; however, only two are illustrated here for an understanding of the invention. Base wells 16, also referred to as base regions, are laterally spaced apart from one another and extend from first major surface 12 into drift region 11. Base wells 16 have a concentration of P type impurity material ranging between approximately $4.5 \times 10^{13}$ atoms per cubic centimeter and approximately $5.5 \times 10^{13}$ atoms per cubic centimeter, and form PN junctions with drift region 11. Base wells 16 may have, for example, a maximum width of approximately 20 micrometers and a maximum depth of approximately 4 micrometers.

A source region 17 is formed in each base well 16. Source region 17 has a central opening (like a donut) and in the cross-sectional view is illustrated as two source wells of N conductivity type. Source region 17 is also referred to as a source. A channel is formed in the base region between source regions 17 and drift region 11 which is adjacent first major surface 12. Source regions 17 extend from first major surface 12 into base wells 16 and have a concentration ranging between approximately $1 \times 10^{16}$ atoms per cubic centimeter and approximately $5 \times 10^{16}$ atoms per cubic centimeter, thus the doping concentration of source regions 17 is greater than that of base wells 16. Source regions 17 of the cross-sectional view may have, for example, a width ranging between approximately 1.0 and approximately 3.0 micrometers and a maximum depth of approximately 1.5 micrometers.

A first dielectric layer 18, commonly referred to as a gate oxide, is formed on first major surface 12. Gate electrodes 19 are patterned over first dielectric layer 18 wherein each gate electrode 19 extends laterally from a portion of a source well 17 in one base well 16 to a portion of a proximal source well 17 in an adjacent base well 16. Thus, gate electrodes 19 extend over two adjacent channels. Gate electrodes 19 are formed from an electrically conductive material such as, polysilicon, aluminum, or the like. Gate electrodes 19 and exposed portions of first dielectric layer 18 are covered by a second dielectric layer 20.

Windows are formed in first and second dielectric layers 18 and 20, respectively, which expose a portion of first major surface 12. More particularly, the windows expose a portion of first major surface 12 over source 17 that is within a single base well 16. Further, the windows expose the portion of first major surface 12 that is illustrated as being between the source regions 17 in each base well 16. A source electrode 23 is formed over the exposed first portion of first major surface 12 and over second dielectric layer 20. Thus, source electrode 23 forms an electrical contact which is over a portion of base wells or regions 16 and a portion of source regions 17. Preferably, source electrode 23 is aluminum.

Techniques for the formation of base and source regions 16 and 17, respectively, dielectric layers 18 and 20, gate electrodes 19 and source electrode 23 include conventional semiconductor processing steps such as masking, ion implantation, diffusion, photolithography, etc. The use of conventional semiconductor processing steps are well known in the art and may be found in U.S. Pat. No. 5,178,370 which issued to Clark et al on Jan. 12, 1993 and is entitled "Conductivity Modulated Insulated Gate Semiconductor Device", which is hereby incorporated herein by reference. Thus, a portion of an insulated gate semiconductor device is formed in the upper portion of drift region 11, wherein the portion includes a field effect transistor and a bipolar transistor, a source electrode 23 and a gate electrode 19.

In accordance with the present invention, a minority carrier injecting metal-semiconductor contact or electrode is formed with semiconductor substrate 11. Preferably, the metal is selected such that a metal-semiconductor barrier height between the metal and semiconductor substrate 11 is between approximately 0.60 electron volts and approximately 0.8 electron volts. The barrier height between the metal and semiconductor substrate 11 is also referred to as the barrier potential. In a preferred embodiment, the minority carrier injecting metal-semiconductor contact is formed at second major surface 13, wherein the metal contacts semiconductor material (i.e., semiconductor substrate 11) of a single conductivity type having a substantially uniform concentration of N type impurity material. In other words, the minority carrier injecting metal-semiconductor contact forms a continuous contact with second major surface 13 wherein second major surface 13 is of one conductivity type i.e., N type and the contact serves as an anode contact.

The selection of the metallization scheme is in accordance with the injection requirements for the particular IGBT. In other words, the metallization scheme is selected in accordance with the desired metal-semiconductor barrier height that produces current flow via injection of minority carriers. A first layer 24 comprises a combination of platinum and nickel having a thickness of approximately 50 nanometers. First layer 24 is covered by a second layer 25 comprising a combination of titanium and tungsten and having a thickness of approximately 75 nanometers. The third layer 26 comprises nickel having a thickness of approximately 200 nanometers, and the fourth layer 27 comprises gold having a thickness of approximately 50 nanometers. Although the metallization scheme of the single figure is shown as a multi-layer metal structure, it shall be understood that layers 25, 26, and 27 merely provide properties to protect the minority carrier injecting metal-semiconductor contact formed by first layer 24 from mechanical stresses. Accordingly, the presence and the materials of layers 25, 26, and 27 are not limitations of the present invention.

Although each metal layer is important for IGBT performance, first layer 24 defines the barrier height of the minority carrier injecting metal-semiconductor contact and forms a second current conducting electrode. The relative ratio of the platinum to nickel in first layer 24 is selected to give a desired metal-semiconductor barrier height. In one example, a mixture of approximately 15% platinum to approximately 85% nickel produces a metal-semiconductor barrier height of approximately 0.65 electron volts. In another example, a ratio of approximately 60% platinum to approximately 40% nickel produces a metal-semiconductor barrier height of approximately 0.7 electron volts. In yet another example, 100% platinum produces a metal-semiconductor barrier height of approximately 0.75 electron volts.

In another example of the vertical embodiment, nickel may be used to form a metal-semiconductor contact provides minority carrier injection. Moreover any refractory metal capable of providing a barrier height of greater than approximately 0.60 electron volts will produce a high efficiency of minority carrier injection and thus may be used for the second current conducting electrode. Further, a metal-semiconductor barrier height of approximately 0.8 electron volts can be achieved by using gold to form a metal-semiconductor contact and provide minority carrier injection.

In a second embodiment (not shown), a minority carrier injecting metal-semiconductor contact is formed on major surface 12 at a location remote from the common conduction region between base regions 16. In other words, the minority carrier injecting metal-semiconductor contact is remote from gate electrode 19. In the lateral Insulated gate semiconductor device, the anode contact to drift region 11 is made from first major surface 12.

By now it should be appreciated that a method for forming an insulated gate semiconductor device has been presented. Using the method of the present invention, an insulated gate semiconductor device having a plurality of contacts is fabricated in a semiconductor substrate, wherein a portion of the insulated gate semiconductor device is formed in the first portion bounded by the first major surface. The portion of the insulated gate semiconductor device comprises a field effect transistor and at least on bipolar transistor and has a control electrode 19 and a first current conducting electrode 23.

A metal-semiconductor contact capable of injecting minority carriers into monocrystalline semiconductor substrate 11 is formed wherein the metal-semiconductor contact serves as an anode of the insulated gate semiconductor device. The anode may contact the first or the second major surface of the semiconductor substrate. In other words, the metal-semiconductor contact serves as a second current conducting electrode 24 which forms a minority carrier injecting metal-semiconductor electrode with the monocrystalline semiconductor substrate. Further, the amount of injection of minority carriers is controlled by the barrier height of the metal-semiconductor contact which in turn is controlled by the selection of the metal. The metal of the metal semiconductor contact is selected to ensure sufficient injection for conductivity modulation of the drift region and hence a low collector-emitter saturation voltage ($V_{CEsat}$).

An advantage to forming a minority carrier contact, such as the anode of the present invention, is that the wafer processing is simplified because the drift region irradiation step may be eliminated. Drift region irradiation is typically performed at locations away from the semiconductor manufacturers own processing facilities and thus incurs both financial and time expenses. Thus eliminating the drift region irradiation step decreases both the expense and cycle time associated with manufacturing insulated gate semiconductor devices.

Drift region irradiation damages the gate oxide, it also lowers the threshold voltage of the MOSFET device. Semiconductor manufacturers typically include a post-irradiation anneal to raise the threshold voltage. Since the present invention eliminates the irradiation step, the threshold voltage is not lowered, thereby eliminating the need for the post-irradiation anneal. In addition, the present invention lends itself to the use of non-epitaxially grown silicon such as, for example, silicon formed using either a Czochralski process or a float-zone process, thereby allowing a further cost savings.

Further, the use of a semiconductor material of a single conductivity type allows using a thinner semiconductor material and the subsequent formation of thinner IGBT's. In other words, the technique of forming an epitaxial layer of one conductivity type or concentration over a semiconductor substrate material of a second conductivity type or having a different concentration is eliminated. Thinner IGBT's have a lower "on" resistance, a higher conductivity, and higher switching speeds than IGBT's formed using conventional IGBT processing techniques and having typical thicknesses.

I claim:

1. A method of forming an insulated gate bipolar transistor, comprising the steps of:
   providing a semiconductor substrate, the semiconductor substrate having a first major surface, a second major surface, and being of a first conductivity type and a first concentration;
   forming at least one region of a second conductivity type, the at least one region of the second conductivity type extending from the first major surface into the semiconductor substrate;
   forming at least one region of the first conductivity type in the at least one region of the second conductivity type, the at least one region of the first conductivity type extending from the first major surface into the at least one region of the second conductivity type;
   forming a first layer of dielectric material over the first major surface;
   forming an electrically conductive material on the first layer of dielectric material;
   forming a second layer of dielectric material over the first layer of dielectric material and over the electrically conductive material on the first layer of dielectric material;
   forming an electrical contact which contacts a portion of the at least one region of the first conductivity type and a portion of the at least one region of the second conductivity type; and
   forming an electrode comprising at least one layer having a mixture of at least two different metals, the at least one layer having the mixture of the at least two different metals directly in contact with the semiconductor substrate of the first conductivity type and the first concentration, wherein the electrode is capable of injecting minority carriers into the semiconductor substrate.

2. A method of forming an insulated gate bipolar transistor as claimed in claim 1, wherein the step of forming an electrode includes forming the electrode at a location remote from the electrically conductive material on the first layer of dielectric material.

3. A method of forming an insulated gate bipolar transistor as claimed in claim 1, wherein the step of forming an electrode includes forming the electrode to the second major surface of the semiconductor substrate, and wherein the electrode forms a continuous contact with the second major surface.

4. A method of forming an insulated gate bipolar transistor as claimed in claim 1 wherein, the step of forming an electrode includes forming a multi-layer metal structure having a first layer comprising nickel and platinum, a second layer comprising titanium and tungsten, a third layer comprising nickel, and a fourth layer comprising gold.

5. A method of forming an insulated gate bipolar transistor as claimed in claim 1, wherein the step of forming an electrode comprising at least one layer having a mixture of at least two different metals includes forming the electrode having a barrier potential of 0.60 electron volts.

6. A method of forming an insulated gate bipolar transistor as claimed in claim 1, wherein the step of forming an electrode further comprises forming the mixture of the at least two different metals as a mixture of platinum and nickel.

7. A method of forming an insulated gate bipolar transistor as claimed in claim 6, wherein the step of forming an electrode further comprises forming the mixture of the at least two different metals as a mixture of platinum and nickel includes forming the mixture having 15% platinum and 85% nickel.

8. A method of forming an insulated gate bipolar transistor as claimed in claim 6, wherein the step of forming an electrode further comprises forming the mixture of the at least two different metals as a mixture of platinum and nickel includes forming the mixture having 60% platinum and 40% nickel.

9. A method of forming an insulated gate semiconductor device, comprising the steps of:
providing a monocrystalline semiconductor substrate having a substantially uniform impurity concentration of N conductivity type and further having a first portion bounded by a first major surface and a second portion bounded by a second major surface;
forming a portion of an insulated gate semiconductor device in the first portion bounded by the first major surface, the portion of the insulated gate semiconductor device having a control electrode and a first current conducting electrode and wherein the portion of the insulated gate semiconductor device comprises a field effect transistor and at least one bipolar transistor; and
forming a second current conducting electrode, the second current conducting electrode directly in contact with the monocrystalline semiconductor substrate and comprising a mixture of at least two metals which is in contact with the monocrystalline semiconductor substrate.

10. A method of forming an insulated gate semiconductor device as claimed in claim 9 wherein the step of forming the second current conducting electrode includes contacting the second major surface of the monocrystalline semiconductor substrate of N conductivity type with the mixture of the at least two metals.

11. A method of forming an insulated gate semiconductor device as claimed in claim 9 wherein the step of forming a second current conducting electrode includes forming a metal-semiconductor contact having a metal-semiconductor barrier height between 0.60 electron volts and 0.75 electron volts, inclusive.

12. A method of forming an insulated gate semiconductor device as claimed in claim 11 wherein the step of forming a second current conducting electrode includes forming the metal-semiconductor contact having a metal-semiconductor barrier height of 0.7 electron volts.

13. A method of forming an insulated gate semiconductor device as claimed in claim 11, wherein the step of forming a second current conducting electrode includes forming a metal-semiconductor contact having a metal-semiconductor barrier height of 0.65 electron volts.

14. A method of forming an insulated gate semiconductor device as claimed in claim 9 wherein the step of forming the second current conducting electrode comprises using a combination of platinum and nickel for a portion of the second current conducting electrode.

15. A method of forming an insulated gate semiconductor device as claimed in claim 14 wherein, the step of forming a second current conducting electrode comprises using a combination of 15% platinum and 85% nickel for a portion of the second current conducting electrode.

16. A method of forming an insulated gate semiconductor device as claimed in claim 14, wherein the step of forming a second current conducting electrode comprises using a combination of 60% platinum and 40% nickel for a portion of the second current conducting electrode.

* * * * *